(12) United States Patent
Sahoo

(10) Patent No.: US 6,975,696 B1
(45) Date of Patent: Dec. 13, 2005

(54) BUILT-IN SELF TEST FOR A COUNTER SYSTEM

(75) Inventor: Naren K. Sahoo, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 11/076,785

(22) Filed: Mar. 10, 2005

(51) Int. Cl.[7] .............................................. G06M 3/00
(52) U.S. Cl. ............................ 377/20; 377/29; 377/39
(58) Field of Search .............................. 377/20, 29, 39; 368/155

(56) References Cited

U.S. PATENT DOCUMENTS 5,473,651 A * 12/1995 Guzinski et al. .............. 377/29
6,665,367 B1 * 12/2003 Blair ........................... 377/20

* cited by examiner

Primary Examiner—Margaret R. Wambach
(74) Attorney, Agent, or Firm—Lisa K. Jorgenson; Bruce Terry

(57) ABSTRACT

A self test for a counter system in an integrated circuit includes a clock coupled to counters in a plurality of counters. A first counter in the plurality of counters has a first counter output and a first counter rollover. A second counter in the plurality of counters has a second counter output, a second counter rollover less than the first counter rollover, and a second counter rollover signal that is active when the second counter has rolled over. A comparison circuit having inputs coupled to the first and second counter outputs, compares the first and second counter outputs to produce a counter error output signal. A latch latches the counter error output signal in response to the second counter rollover signal being inactive and the counter error output signal indicating a difference in the first and second counter outputs. Counters may be segmented to reduce a number of digits.

17 Claims, 4 Drawing Sheets

BUILT-IN SELF TEST FOR A COUNTER SYSTEM

BACKGROUND OF THE INVENTION

1. Field of the Invention

The present invention relates generally to a method and circuit for executing a self test in an integrated circuit, and more specifically to a built-in self test for a counter system, such as a real-time clock, in an integrated circuit.

2. Description of the Prior Art

A counter is a frequently used circuit in computers, control systems, and other electronic devices. Generally, a counter has a register whose contents step through a regular series of states, which are usually states indicating consecutive integers. The counter is typically incremented by a clock signal, wherein the rising or falling edge of the clock transition causes the counter to change from one state to another. A counter may also be set or loaded with an initial value by writing data into the counter register, or by activating a reset function in the counter.

A counter circuit frequently includes an output signal, called a "carry out," that indicates that the counter has reached its maximum value, and that the next counter value will "rollover" to begin counting from an initial value. For example, a counter having two decimal digits may count from 00 to 99, and then roll back over to 00 at the next counter increment. The carry out signal is used to cascade a series of counters in order to make a counter system comprised of several counters, wherein the counter system may count to larger numbers through the aggregation or cooperation of a plurality of smaller counters.

For example, with reference to FIG. 1, there is depicted a counter system 20, which is known in the prior art. Counter system 20 includes a plurality of cascaded counters that cooperate in a system that may be used in a controller to keep track of various quantities, or that may be used to control stages or modules in a computer controlled process. In the specific example depicted in FIG. 1, counter system 20 is used to implement a real-time clock, which keeps track of a plurality of units of time.

As illustrated, counter system 20 includes century counter 22, year counter 24, month counter 26, day counter 28, hour counter 30, minute counter 32, second counter 34, and millisecond counter 36. All counters 22–36 are based on an up-counter logic. In normal operation, millisecond counter 36 is incremented by clock 38, which in the real-time clock has a frequency of 1,000 Hz, and is typically derived from a crystal oscillator. Millisecond counter 36 counts from an initial value to 999, where the initial value may be written into a register within millisecond counter 36. Once millisecond counter 36 reaches its maximum count value of 999, millisecond counter 36 makes carry-out signal 40 active, which becomes a signal indicating to second counter 34 that it should be incremented by 1 at the next clock transition, as millisecond counter 36 rolls over to 000. Thus, carry out signal 40 is active during the period when millisecond counter 36 has reached its maximum value before it rolls over to an initial value.

In a real-time clock system of counters, some counters have an initial counter value of 0 and count to a full decimal count of 99 or 999. For example, century counter 22 and year counter 24 each count from 00–99, and millisecond counter 36 counts from 000–999. When year counter 24 reaches 99, year carry out signal 52 is active.

Other counters in the real-time clock do not rollover at the full decimal count. For example, seconds counter 36 and minutes counter 32 both rollover after reaching a maximum count of 59, which means that second carry out 42 and minutes carry out 46 will be active at their respective maximum count values. Hour counter 30 rolls over after a full count of 23, which is when hour carry out 46 is active. Day counter 28 has a maximum count value that depends upon values in the current month and year counter counters, wherein the maximum day count can have values of 28, 29, 30, or 31. Whatever the current maximum count may be, when day counter 28 reaches that value, day carry out signal 46 will be active. Most counters in counter system 20 roll over to an initial counting value of 0, but day counter 28 and month counter 26 each roll over to an initial value of 1.

During the manufacture of integrated circuits containing counter systems, it is necessary to test clock functions to insure the functioning and the quality of the part. Integrated circuits frequently include built-in tests that allow an integrated circuit to test at least a portion of its functions internally, and to report any error conditions so that the part may be repaired or scrapped.

When designing a built-in self test, minimizing the time required to perform the test is an important design goal. For example, to increment the real-time clock millisecond-by-millisecond over a number of counts representing 100 years would take a very long time, even if a test clock was faster by many orders of magnitude than the 1,000 Hz clock used in normal operation. Further complicating the task of designing a fast and efficient built-in self test is the fact that several counters in the system may have different numbers of digits, and many counters may have different rollover points.

Therefore, it should be apparent to those persons skilled in the art that a need exists for an improved method and system for testing a clock system having a plurality of cascaded clocks, wherein the improved test has the advantage of incrementing and testing a substantial number of the counting states of the clock system in a short period of time, despite the fact that various counters may have different numbers of digits, different rollover points, and different initial counting values following a rollover.

BRIEF DESCRIPTION OF THE DRAWINGS

For a more complete understanding of the present invention, and the advantages thereof, reference is now made to the following descriptions taken in conjunction with the accompanying drawings, in which like numbers designate like parts, and in which.

DESCRIPTION OF THE PREFERRED EMBODIMENTS

Figure 2:
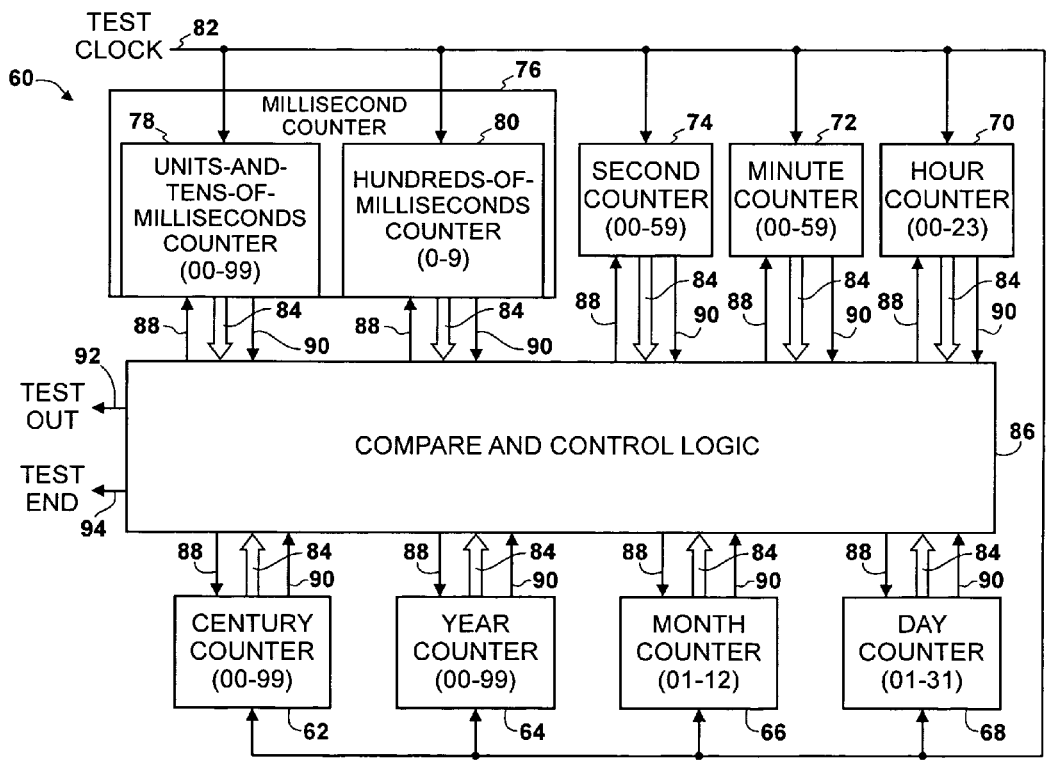
FIG. 2 is a high-level block diagram of a counter system that is configured for a built-in self test in accordance with the method and system of the present invention.

With reference now to the drawings, and in particular with reference to FIG. 2, there is depicted a high-level block diagram of a counter system that is configured for a built-in self test in accordance with the method and system of the present invention. As illustrated, counter system 60 includes a plurality of counters—century counter 62, year counter 64, month counter 66, day counter 68, hour counter 70, minute counter 72, second counter 74, and millisecond counter 76—all connected to test clock 82. Each of counters 62–76 includes a data output 84 that couples data representing a current counter register value to compare and control logic 86, which is used to control, test, and report on the proper operation of counters 62–76.

Note that millisecond counter 76 has been divided or "segmented" into two separate counters 78 and 80. Segmented counters 78 and 80 are discussed in more detail below. Counters 62–80 (which refers to counters 62–74 and segment counters 78–80 within counter 76) are each coupled to preset control signal 88 from compare and control logic 86, which is a signal that allows a preset value to be loaded into the counting register of each counter. For example, preset control signal 88 may be used to set the value in all counter registers to 0 prior to beginning the built-in self test.

Counters 62–80 may also have a rollover signal 90, which is sent from the respective counter to compare and control logic 86 to indicate that the particular counter has rolled over after counting to its maximum count value. For example, rollover signal 90 from second counter 74 will become active at the clock pulse that causes second counter 74 to rollover from 59 to 00.

Note that carryout signals are not shown between counters 62–80 because dependency upon the carryout function has been disabled in order to prepare counter system 60 for testing in accordance with the present invention. With the dependency upon carryout signals disabled, each counter is set to increment one count for each period of test clock 82. Thus, in the embodiment shown, each of the plurality of counters, or segments of counters, may be incremented through an entire sequence of allowed counter values in 100 clock pulses or less, assuming that no counter or counter segment has more than two decimal digits.

Signals output from compare and control logic 86 indicate the results of the test and the status of the test. For example, test out signal 92 may be single bit output that indicates whether or not any counter in counter system 60 has a data output error in the currently executing self test. Test end signal 94 may be a single bit that indicates whether all data output values of all counters have been tested and whether the built-in self test has ended.

While the built-in self test may be used to test integrated circuits during their manufacture, the self test may also be used in a finished electronic system in order to verify that at least some counter system functions are properly working. For example, in systems where it is important that counter system 60 operate correctly, the built-in self test may be performed periodically, such as every few hours or days, or upon system start up, wherein various other aspects of the system may also be tested. If the counter system is tested periodically or during start up, it is also important that the test be fast and efficient so that testing will not interfere with other functions that depend upon counter system 60, or so that equipment users will not have to wait long during power up tests.

Figure 3:
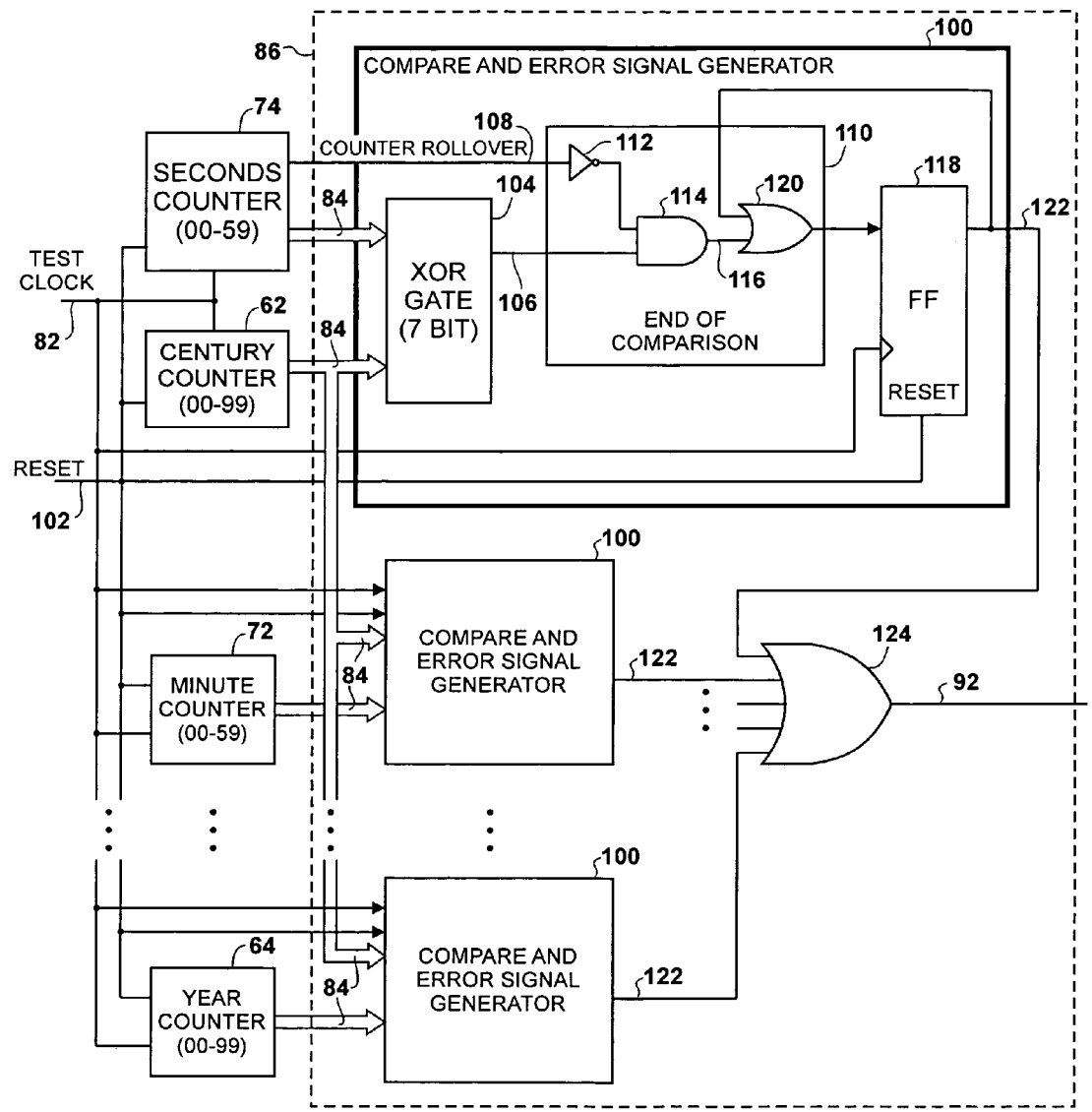
FIG. 3 is a more detailed illustration of the compare and control logic of FIG. 2 in accordance with the method and system of the present invention.

With reference now to FIG. 3, there is depicted a more detailed illustration of compare and control logic 86 of FIG. 2 in accordance with the method and system of the present invention. As illustrated, multiple compare and error signal generator circuits 100 may be used in parallel to compare data outputs 84 from pairs of counters 62–80 (see FIG. 2). In the embodiment illustrated in FIG. 3, century counter 62 is used as a "primary" counter, which is a counter having a value or output that is compared to each of the "secondary" or "other" counters in counter system 60. One reason century counter 62 is selected as a primary counter is that its counter rollover is 99, which is a full two-digit decimal count. This means that century counter 62 is designed to output all decimal integer values between 00 and 99, which is useful in comparisons to other counters that also count from 00 to 99.

All tested counters 62–80 are connected to test clock 82, which is used to increment the counters from an initial value through each successive counter value until a maximum count value is reached, at which point the counter will rollover to a beginning count value.

Reset signal 102 may be used to initialize counters 62–80 to a preferred initial value of 0. Note that month counter 66 and day counter 68 may also be initialized to 0, even though their initial count value is typically 1 following a rollover.

Within compare and error signal generator 100 at the top of FIG. 3, XOR gate 104 receives data 84 from counters 62 and 74 and performs a bit-by-bit comparison of data 84 to produce counter error output signal 106, which indicates whether or not data 84 matched. In a preferred embodiment, XOR gate 104 performs an exclusive-OR function using data 84 on the two inputs to produce a signal that is active high if the data on the two inputs does not exactly match bit-for-bit.

Because seconds counter 74 rolls over after counting to 59, and century counter 62 does not, XOR gate 104 would indicate a counter error for any comparisons beyond count 59. This is because the count after 59 compares century counter 62 having a value of 60 to seconds counter 74 having a rolled-over value of 00. In order to handle this counter mismatch and to prevent this comparison from being reported as a counter error, seconds counter 74 generates counter rollover signal 108 that becomes active in the clock period after counter 74 rolls over from 59 to 00. Once counter rollover signal 108 is active, it remains active for the duration of the test. The purpose of counter rollover signal 108 is to indicate that a counter has rolled over, and the signal is used to disregard or mask any errors in comparison between a counter that is rolled over and a counter that has continued past the maximum value of the counter that has rolled over. Comparing a counter that has rolled over to a counter that has not rolled over is not useful for the self test.

In order to prevent a mistaken error after a counter rollover, end of comparison circuit 110 is used to mask or prevent any erroneous reporting of a counter error. As illustrated, counter rollover 108 is inverted by inverter 112 and passed to an input of AND gate 114. Counter error output signal 106 is used as a second input into AND gate 114 and the output of AND gate 114, which may be referred to as a "qualified counter error signal" 116, is an error signal that indicates a counter comparison error only if the counters being compared have not rolled over. This should insure that both counters are compared as they count together until one counter rolls over, at which point errors will not be reported or indicated by qualified counter error signal 116.

Latch 118 and OR gate 120 are used to latch qualified counter error signal 116, which indicates a counter comparison error. Once latched, the error-indicating signal is held for the remainder of the test. Latch 118 is preferably implemented with a flip-flop that is clocked by test clock 82. The output of latch 118 is fed to one input of OR gate 120, with the other input of OR gate 120 receiving qualified counter error signal 116. The output of latch 118 may be referred to as a latched counter error signal 122, which signal indicates whether or not a comparison error occurred during any counter period in the qualified range of counts before any counter in the comparison rolls over.

Latched counter error signals 122, which are output by compare and error generator circuits 100, are each summed to generate a composite error signal for the whole counter system. In a preferred embodiment, the error signals are summed or aggregated by ORing the signals using OR gate 124, wherein the output of OR gate 124 is test out signal 92.

Figure 4:
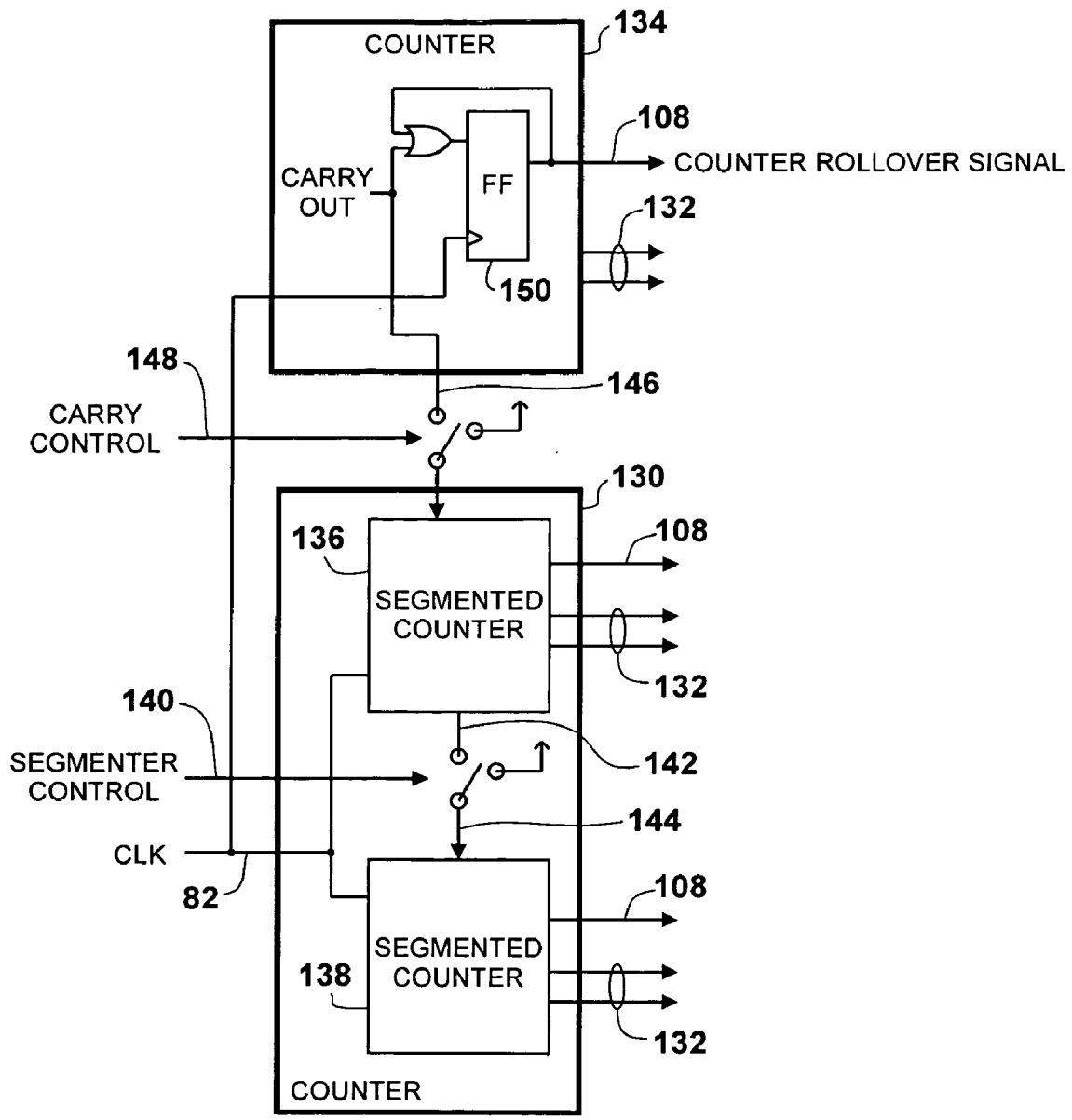
FIG. 4 is a more detailed illustration of the segmentation of a counter in accordance with the method and system of the present invention.

With reference now to FIG. 4, there depicted a more detailed illustration of the segmentation of a counter in a counter system in accordance with the method and system of the present invention. As illustrated, counter 130 normally operates as a four-digit counter having four output digits 132. Notice that output digit 132 may be a signal binary bit, or may be a collection of binary bits, such as the binary bits that represent a decimal numeral. If output digits 132 of counter 130 will be compared to the output of a counter having two digits, such as counter 134, then counter 130 will be segmented or divided to form two segmented counters 136 and 138, which each have two output digits 132.

In order to segment a counter, segmentor control signal 140 may be used to disable carry out signal 142 so that counters 136 and 138 both advance one increment during each period of clock 82. Disabling carry out 142 may be implemented by setting carry in 144 to counter 138 to the active state so that counter 138 increments during each period of clock 82. Note that this is similar to disabling carry signal 146 between counter 134 and counter 130, which signal is disabled for testing by carry control signal 148. When carry control signal 148 is set to disable dependencies between cascaded counters, carry in signals to each counter stage may be set active to force each counter to increment during each clock cycle.

FIG. 4 also shows additional detail regarding the generation of counter rollover signal 108. As illustrated, carry signal 146 generated in counter 134 is active when the register in counter 134 contains a full or maximum count value just prior to rolling over. On the clock pulse that causes counter 134 to rollover, latch 150 latches carry signal 146 so that counter rollover signal 108 becomes active in the clock period of the rollover of counter 134, and remains active during each clock period thereafter until it is reset. Thus, counter rollover signal 108 becomes active when counter 134 is loaded with its initial count value because of a rollover condition, and remains active thereafter.

Figure 5:
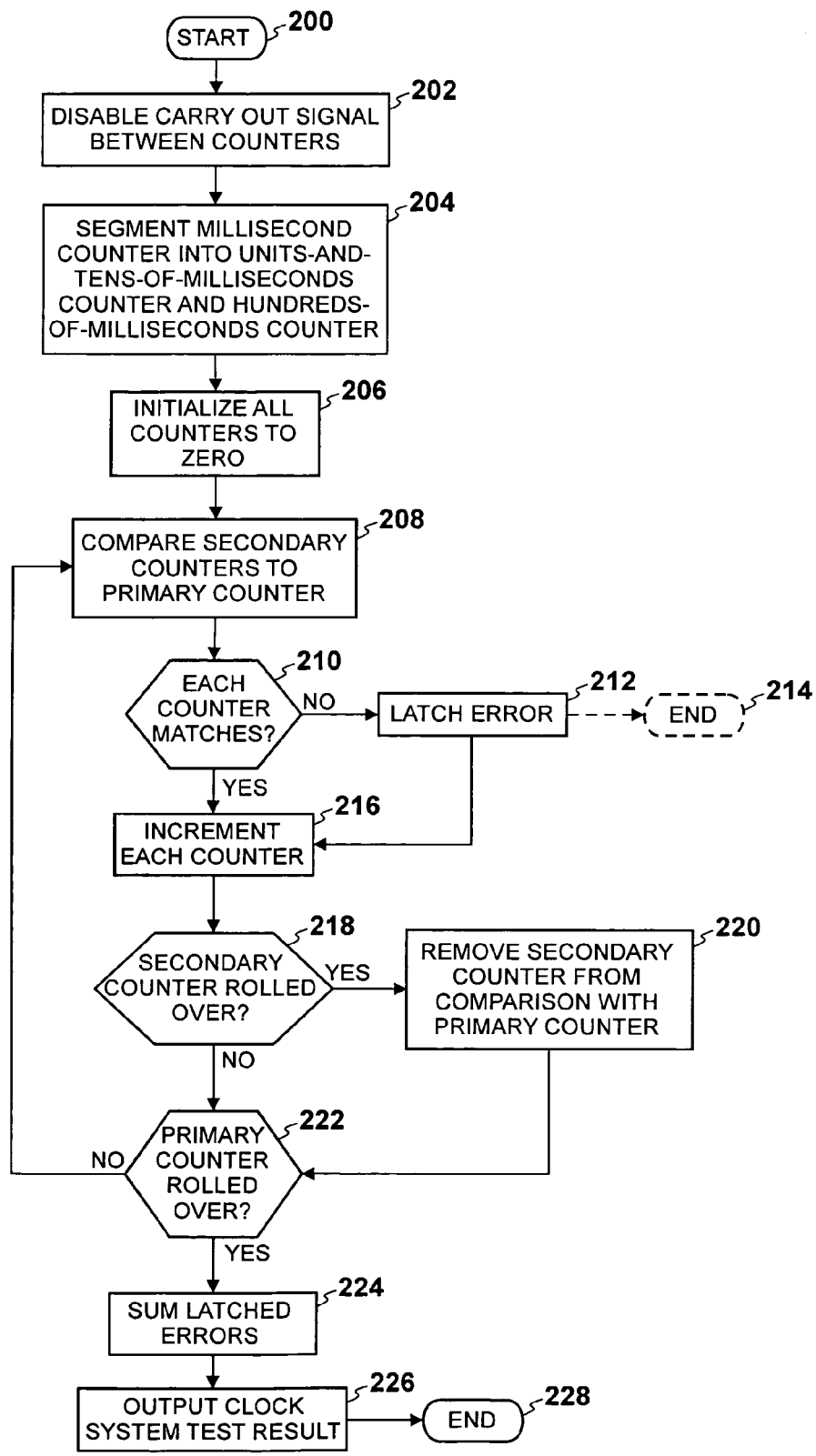
FIG. 5 is a high-level logic flowchart that illustrates the method and operation of the counter system self test in accordance with the method and system of the present invention.

Referring now to FIG. 5, there is depicted a high-level logic flowchart that illustrates the method and operation of the counter system self test in accordance with the method and system of the present invention. As illustrated, the process begins at block 200, and thereafter passes to block 202 wherein the process disables the carry out signal between cascaded counters in a counter system. The purpose of this step is to configure the counters to increment during each clock period, which means that the dependencies between cascaded counters is removed. By causing each counter to increment during each clock period, the time required to test each counter in all counter states is significantly reduced. This step may be implemented using carry control signal 148 as shown in FIG. 4, which is discussed above.

Next, the process segments counters that have a larger number of digits so that no counter or counter segment has more digits than a primary counter it is being compared to. In the specific embodiment illustrated at block 204, the process segments three-digit millisecond counter 76 in FIG. 5 into units-and-tens-of-milliseconds counter 78 having two digits, and hundreds-of-milliseconds counter 80 having a single digit. This process is illustrated in more detail in FIGS. 2 and 4. When a counter having a larger number of digits is segmented, each segment acts as an independent counter. For example, when millisecond counter 76 in FIG. 2 is segmented into units-and-tens-of-milliseconds counter 78 and hundreds-of-milliseconds counter 80, counter 78 acts as a two-digit counter that counts from 00 to 99 and counter 80 act as a single-digit counter that counts from 0 to 9. Segmented counter 80 operates independently of segmented counter 78.

Counter segments should have the same number of bits, or fewer number of bits, or digits, than a primary counter, which is used as a reference to compare to counter outputs of all other, or secondary, counters. In the example shown in FIG. 2, no counter or counter segment has more than two decimal digits, which means that all counter outputs may be tested in all states by counting from 00 to 99.

Figure 1:
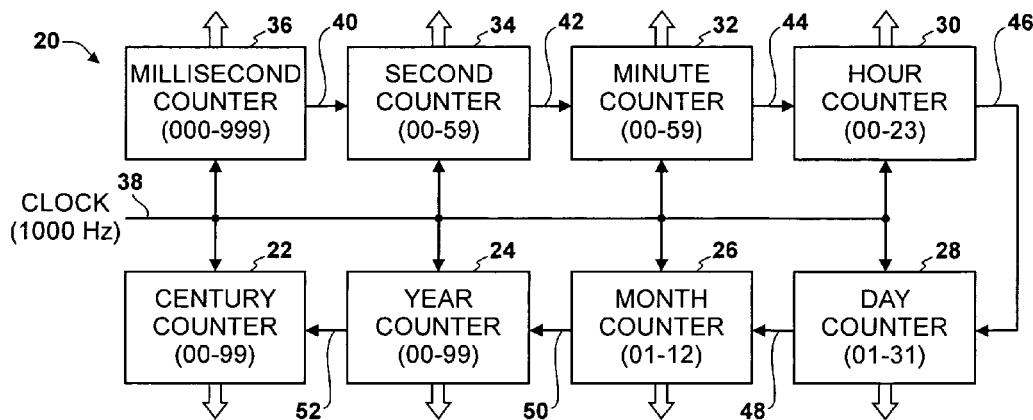
FIG. 1 is a high-level block diagram of a counter system having a plurality of cascaded counters for implementing a real-time clock, which counter system is known in the prior art.

After segmenting counters that are larger than the primary counter, the process initializes all counters to 0, as depicted at block 206. This step may be implemented by resetting all the counters using reset 102 in FIG. 3, or by writing 0 into the count register of each counter using preset control signal 88 in FIG. 1. Note that counters that rollover to a number other than 0—which happens in day counter 68 and month counter 66—can be forced to begin counting at 0 so that they can be compared to a primary counter which has also been set to begin at 0.

Next, the process compares all secondary counters to the primary counter, as illustrated at block 208. In relation to the example shown in FIGS. 2 and 3, the primary counter is century counter 62 in counter system 60, which implements a real-time clock. The comparing step is a bit-wise comparison that preferably uses a Boolean XOR (exclusive-OR) function that outputs a "1" when counter values do not match, thus indicating a counter error condition. Note that separate XOR compare functions are used for each comparison of century counter 62 to each secondary counter 64–80.

After comparing the primary counter to each secondary counter, the process determines whether or not each counter output matches the primary counter, as depicted at block 210. If any secondary counter does not match the primary counter, the process latches the error condition, as illustrated at block 112. This latching step may be implemented by setting flip-flop 118, which remains set for the duration of the test (See FIG. 3).

Once a counter error has been detected, the process may optionally terminate, as shown at block 214, because a single counter error is normally enough to declare an integrated circuit or system inoperable.

If at block 210, the process determines that each counter matches, the process next increments each counter in the counter system, as depicted at block 216. In a preferred embodiment, each counter is incremented during each cycle of the test clock signal.

After incrementing each counter, the process determines whether or not any of the secondary counters have rolled over, as illustrated at block 218. If any of the secondary counters have rolled over, that particular secondary counter is removed from the comparison with the primary counter, as illustrated at block 220. The step of removing the counter from the comparison may be implemented by masking the comparison result so that the comparison result does not indicate a counter error after the secondary counter has rolled over. Note that any previous errors prior to the counter rolling over have been latched and stored at block 212. Masking the comparison result may be implemented using counter rollover signal 108 as described above with reference to FIG. 3.

After removing any counters that have rolled over, the process determines whether or not the primary counter has rolled over, as depicted at block 222. If the primary counter has not rolled over, the process returns to block 208, wherein the primary counter is compared to each secondary counter. If, however, the primary counter has rolled over, the process of comparing counters is finished, and the process sums any latched errors, as illustrated at block 224. In the step of summing the errors, the process examines latches 118 for an indication of an error in any counter in the system. An error in any single counter will indicate an error for the system. This step is preferably implemented by ORing latched counter error signals 122, as shown at OR gate 124 in FIG. 3.

After summing the latched errors, the process outputs the counter system test result, as illustrated at block 226. The system test result 92 may be determined by the sum of the latched counter errors 122. If none of the counters had any errors, the test result indicates the system has passed. However, if any single counter had an error at any count that was prior to a rollover condition, the counter system test result indicates that the system fails.

As illustrated at block 228, the built-in self test is terminated after counter system test result 92 has been output. As the test is terminated, a test end signal 94 may become active, thereby indicating that the test result 92 is valid and may be read.

In alternative embodiments of the present invention, a built-in self test circuit may use more than one primary counter as a reference for comparing to multiple secondary counters. Additionally, the primary counter may include more than two output digits, in which case each secondary counter should have the same or lesser number of output digits compared to the primary counter. With regard to test clock 82, the speed of the clock during testing is preferably faster than the clock frequency used during normal operation of the counter circuit so that testing the counter circuit is faster.

While the counter system self test described herein does not test every feature and function of some counter systems, other circuitry and test methods may be used to test, for example, rollovers to the proper initial value, and special conditions or exceptions in rollover values or initial values, such as those encountered in a clock system that accounts for a different number of days in different months, and leap year situations. While all conditions and functions may not be tested, the self test for a counter system disclosed herein is able to quickly test the ability of a plurality of counters to increment through a relevant range of counting values. Thus, the self test of the present invention should prove valuable in quickly testing complex counter systems during integrated circuit manufacturing, and possibly during self testing of equipment including such integrated circuits.

The foregoing description of a preferred embodiment of the invention has been presented for the purpose of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A self test for a counter system in an integrated circuit comprising:
   a clock coupled to each counter in a plurality of counters;
   a first counter in the plurality of counters having a first counter output and a first counter rollover;
   a second counter in the plurality of counters having a second counter output, a second counter rollover less than the first counter rollover, and a second counter rollover signal that is active when the second counter has rolled over;
   a comparison circuit having inputs coupled to the first and second counter outputs, wherein the comparison circuit compares the first and second counter outputs to produce a counter error output signal; and
   a latch coupled to the clock and having an input coupled to the counter error output signal, wherein the latch latches the counter error output signal in response to the second counter rollover signal being inactive and the counter error output signal indicating a difference in the first and second counter outputs, wherein an output of the latch is a latched counter error signal.

2. The self test for a counter system according to claim 1 wherein the second counter rollover signal is a latched carry out signal that becomes active at a clock increment when the second counter is at a maximum count value.

3. The self test for a counter system according to claim 1 wherein the comparison circuit is an xor circuit for bit-wise comparing the first counter output to the second counter output to produce a single bit counter error output signal indicating a result of the bit-wise comparison.

4. The self test for a counter system according to claim 1 wherein the latch further includes an end of comparison circuit that prevents latching a counter error output signal that indicates a counter error in clock periods after the second counter has rolled over.

5. The self test for a counter system according to claim 4 wherein the end of comparison circuit masks the counter error output signal to generate a qualified error counter signal that is input to the latch so that a counter error is not indicated after the second counter has rolled over.

6. The self test for a counter system according to claim 1 further including:
   a third counter in the plurality of counters, wherein the third counter has a third counter number of digits greater than a first counter number of digits;
   a counter segmenter coupled to the third counter for dividing the third counter into two or more segmented counters, wherein none of the segmented counters has more digits than the first counter number of digits, and wherein each segmented counter is coupled to the clock, and each has a segmented counter output coupled to an input of a respective segment comparison circuit that compares the first counter output to the respective one of the segmented counter outputs and produces a segment counter error output signal;

segment error latches coupled to the clock and each respective segment comparison circuit, wherein each segment error latch latches the segment counter error output signal in response to the respective segment counter error output signal indicating a difference in the first counter output and the respective segmented counter output to produce a latched segmented counter error signal; and a combinatorial logic gate for aggregating the latched segmented counter error signals and the latched counter error signal to produce a counter system test signal.

7. The self test for a counter system according to claim 6 wherein the counter segmenter divides the third counter into a first segmented counter and a second segmented counter, wherein the first and second segmented counters count without dependence on a counter value of the other.

8. The self test for a counter system according to claim 7 wherein the third counter is a three-digit decimal counter, and wherein the segmenter includes a control to disable a carry out signal to divide the third counter into a first segmented two-digit counter and a second segmented one-digit counter, wherein the second segmented one-digit counter has a second segmented one-digit counter rollover signal that is active then the second segmented one-digit counter rolls over after a maximum count value of 9.

9. A real-time clock integrated circuit comprising:
a clock coupled to each counter in a plurality of counters;
a century counter in the plurality of counters, wherein the century counter has a century counter output having two decimal digits, and a century counter maximum count value equal to 99;
a seconds counter in the plurality of counters having a seconds counter output, a seconds counter maximum count value equal to 59, and a seconds counter rollover signal that is active after the seconds counter has rolled over following the seconds counter maximum count value; and
a comparison circuit having inputs coupled to the century counter output and the seconds counter output, wherein the comparison circuit compares the century counter output to the seconds counter output to produce a counter error output signal; and
a latch coupled to the clock and having an input coupled to the counter error output signal, wherein the latch latches the counter error output signal in response to the seconds counter rollover signal being inactive and the counter error output signal indicating a difference in the century counter output and the seconds counter output, wherein an output of the latch is a latched counter error signal.

10. The real-time clock integrated circuit according to claim 9 further including:
a millisecond counter in the plurality of counters, wherein the millisecond counter has three decimal digits;
a counter segmenter coupled to the millisecond counter for dividing the millisecond counter into two segmented counters, including a units-and-tens-of-milliseconds counter having two decimal digits, and a hundreds-of-milliseconds counter having a single decimal digit, and wherein each segmented counter is coupled to the clock, and each has a segmented counter output and a segmented counter rollover signal;
segment comparison circuits, each having inputs coupled to the century counter output and to a segmented counter output, wherein the segment comparison circuits respectively compare the century counter output to the units-and-tens-of-milliseconds counter output, and to the hundreds-of-milliseconds counter output, to produce segmented counter error output signals;

segment latches coupled to the clock and each respective segmented counter error output signals, wherein each segment error latch latches the segmented counter error output signal in response to the respective segmented counter rollover signal being inactive and the segment counter error output signal indicating a difference in the century counter output and the respective segmented counter output to produce latched segmented counter error signals; and a combinatorial logic gate for aggregating the latched segmented counter error signals and the latched counter error signal to produce a counter system test signal.

11. The real-time clock integrated circuit according to claim 10 wherein the units-and-tens-of-milliseconds counter and the hundreds-of-milliseconds counter count without dependence on a counter value of the other.

12. A method for testing a counter system in an integrated circuit comprising the steps of:
disabling carry out signals between counters in a plurality of cascaded counters;
initializing the plurality of counters;
clocking the plurality of counters;
generating a counter rollover signal for a counter of the plurality of counters wherein the counter rollover signal is active when the counter has rolled over;
comparing the value of pairs of counters in the plurality of cascaded counters to create a plurality of counter error signals;
latching a respective counter error signal to produce a latched counter error signal in response to a respective counter error signal indicating different values in the pair of compared counters, and in response to the respective counter rollover signal being inactive; and
aggregating the plurality of latched counter error signals to produce a counter system error signal that indicates a counter system error if any one of the plurality of latched counter error signals indicates an error.

13. The method for testing a counter system according to claim 12 wherein the step of disabling carry out signals between counters in a plurality of cascaded counters further includes the step of configuring the plurality of counters to be increment by a clock signal without regard to the state of a carry out signal from another counter in the plurality of cascaded counters.

14. The method for testing a counter system according to claim 12 wherein the step of comparing the value of pairs of counters in the plurality of cascaded counters to create a plurality of counter error signals further includes the step of XORing the value of pairs of counters in the plurality of cascaded counters to create a plurality of counter error signals.

15. The method for testing a counter system according to claim 12 wherein the step of latching a respective counter error signal further includes the steps of:
ANDing a counter error signal with an inverted counter rollover signal to produce a qualified counter error signal; and
ORing the qualified counter error signals to produce a counter system error signal.

16. The method for testing a counter system according to claim 12 wherein the step of latching a respective counter error signal further includes masking a respective counter error signal from the respective latch if the respective counter rollover signal is active.

17. The method for testing a counter system according to claim 12 further including the steps of:
   selecting a primary counter from the plurality of counters for comparing to the remaining secondary counters of the plurality of counters;
   segmenting a secondary counter that has more digits than the primary counter to produce a plurality of segmented counters, each having segmented counter outputs having no greater number of digits than a number of digits in the primary counter, and wherein each segmented counter increments a count value for each period of the clock; and
   including the segmented counters as ones of the plurality of counters.

* * * * *